United States Patent
Block et al.

(10) Patent No.: US 10,848,127 B2
(45) Date of Patent: Nov. 24, 2020

(54) FILM BULK ACOUSTIC RESONATOR (FBAR) RF FILTER HAVING EPITAXIAL LAYERS

(71) Applicant: INTEL CORPORATION, Santa Clara, CA (US)

(72) Inventors: Bruce A. Block, Portland, OR (US); Sansaptak Dasgupta, Hillsboro, OR (US); Paul B. Fischer, Portland, OR (US); Han Wui Then, Portland, OR (US); Marko Radosavljevic, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 16/323,665
(22) PCT Filed: Sep. 30, 2016
(86) PCT No.: PCT/US2016/054715
§ 371 (c)(1),
(2) Date: Feb. 6, 2019
(87) PCT Pub. No.: WO2018/063305
PCT Pub. Date: Apr. 5, 2018

(65) Prior Publication Data
US 2019/0173452 A1 Jun. 6, 2019

(51) Int. Cl.
*H03H 9/56* (2006.01)
*H03H 3/02* (2006.01)
(Continued)

(52) U.S. Cl.
CPC .............. *H03H 9/564* (2013.01); *H03H 3/02* (2013.01); *H03H 9/02015* (2013.01);
(Continued)

(58) Field of Classification Search
CPC .............. H03H 9/564; H03H 9/02015; H03H 9/02031; H03H 9/02228; H03H 9/132;
(Continued)

(56) References Cited

U.S. PATENT DOCUMENTS

| 7,446,843 B2 | 11/2008 | Yamazaki et al. |
| 9,142,632 B2 | 9/2015 | Yamazaki |

(Continued)

FOREIGN PATENT DOCUMENTS

| TW | 200845144 A | 11/2008 |
| TW | 201611279 A | 3/2016 |
| WO | 2018063305 A1 | 4/2018 |

OTHER PUBLICATIONS

International Search Report and Written Opinion received for PCT/US2016/054715, dated May 24, 2017. 15 pages.

(Continued)

*Primary Examiner* — Samuel S Outten
(74) *Attorney, Agent, or Firm* — Finch & Maloney PLLC

(57) ABSTRACT

Techniques are disclosed for forming resonator devices using epitaxially grown piezoelectric films. Given the epitaxy, the films are single crystal or monocrystalline. In some cases, the piezoelectric layer of the resonator device may be an epitaxial III-V layer such as an Aluminum Nitride, Gallium Nitride, or other group III material-nitride (III-N) compound film grown as a part of a single crystal III-V material stack. In an embodiment, the III-V material stack includes, for example, a single crystal AlN layer and a single crystal GaN layer, although any other suitable single crystal piezoelectric materials can be used. An interdigitated transducer (IDT) electrode is provisioned on the piezoelectric layer and defines the operating frequency of the filter. A plurality of the resonator devices can be used to enable filtering specific different frequencies on the same substrate (by varying dimensions of the IDT electrodes).

20 Claims, 8 Drawing Sheets

(51) Int. Cl.
*H03H 9/02* (2006.01)
*H03H 9/13* (2006.01)
*H03H 9/17* (2006.01)

(52) U.S. Cl.
CPC .... *H03H 9/02031* (2013.01); *H03H 9/02228* (2013.01); *H03H 9/132* (2013.01); *H03H 9/171* (2013.01); *H03H 9/176* (2013.01); *H03H 9/562* (2013.01)

(58) Field of Classification Search
CPC ........ H03H 9/171; H03H 9/176; H03H 9/562; H03H 3/02
See application file for complete search history.

(56) References Cited

U.S. PATENT DOCUMENTS

| | | | |
|---|---|---|---|
| 9,590,587 B1 * | 3/2017 | Thalmayr | ............. H03H 9/059 |
| 2008/0129414 A1 | 6/2008 | Lobl et al. | |
| 2012/0096697 A1 | 4/2012 | Grannen et al. | |
| 2013/0193808 A1 | 8/2013 | Feng et al. | |
| 2019/0187105 A1 * | 6/2019 | Ram | ...................... G01H 11/08 |

OTHER PUBLICATIONS

International Preliminary Report on Patentability received for PCT/US2016/054715, dated Apr. 2, 2019. 11 pages.

Popa, Laura C. and Dana Weinsten, "L-Band Lamb mode resonators in Gallium Nitride MMIC technology," IEEE International Frequency, 2014. 4 pages.

Popa, Laura C. and Dana Weinsten, Switchable Piezoelectric Transduction in ALGAN/GAN MEMS Resonators, IEEE Transducers, Jun. 16-20, 2013. pp. 2461-2464.

Rais-Zadeh, et al., "Gallium Nitride as an Electromechanical Material," Journal of Microelectromechanical Systems, vol. 23, No. 6, Dec. 2014. pp. 1252-1271.

Larson, III, et al, "Characterization of Reversed c-axis AlN Thin Films," IEEE Ultrasonics Symposium (IUS), Oct. 11-14, 2010. pp. 1054-1059.

* cited by examiner

US 10,848,127 B2

FILM BULK ACOUSTIC RESONATOR (FBAR) RF FILTER HAVING EPITAXIAL LAYERS

BACKGROUND

Radio frequency (RF) filters are an important component in modern communication systems. With the growing number of bands and modes of communications, the number of RF filters in a mobile device front end can multiply quickly. Resonators, such as film bulk acoustic resonators (FBAR), sometimes referred to as thin-FBAR (TFBAR), are some components that are used to make RF filters. An FBAR or TFBAR generally includes a piezoelectric material located between two electrodes and acoustically isolated from the surrounding medium. A typical RF front end must filter out multiple operating frequencies, which necessitates multiple distinct RF filters, generally one RF filter for each operating frequency to be filtered.

Figure 1A:
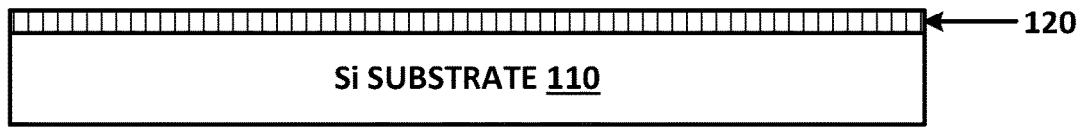
FIGS. 1A-1E illustrate example integrated circuit structures defining an RF filter device including a first epitaxial layer of group III-V semiconductor material and a second epitaxial layer of group III-V semiconductor material, in accordance with an embodiment of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Techniques are disclosed for forming resonator devices using epitaxially grown piezoelectric films. Given the epitaxy, the films are single crystal or monocrystalline. In some cases, the piezoelectric layer of the resonator device may be an epitaxial III-V layer such as an Aluminum Nitride (AlN), Gallium Nitride (GaN), or other group III material-nitride (III-N) compound film (e.g., any combination of one or more of gallium, indium, and aluminum with nitrogen) grown as a part of a single crystal III-V material stack. The III-V material stack includes, for example, one single crystal AlN layer and one single crystal GaN layer, although any other suitable single crystal piezoelectric materials can be used. An interdigitated transducer (IDT) electrode is provisioned on the piezoelectric material and defines the operating frequency of the filter. Therefore, a plurality of the resonator devices can be used to enable filtering specific different frequencies on the same substrate (by varying dimensions of the IDT electrodes). Numerous variations and configurations will be apparent in light of this disclosure.

General Overview

RF filters continue to be a major factor in the cost of RF front end and the total integrated circuit (IC) area available, particularly in light of 5G mobile telecommunication technology on the horizon. Aluminum nitride (AlN) has been a common piezoelectric film material for resonators in the RF filter space. However, due to processing constraints, AlN is deposited via a sputtering technique after back electrode processing. As will be appreciated in light of this disclosure, sputtered AlN is of significantly poorer quality (polycrystalline or amorphous) compared to AlN that is deposited via epitaxial techniques (single crystal, sometimes called monocrystalline), such as, for example, chemical vapor deposition (CVD), metal-organic chemical vapor deposition (MOCVD) and molecular-beam epitaxy (MBE). Generally, sputtered AlN films have poor crystalline quality which generally leads to degraded filter performance.

Thus, and in accordance with one or more embodiments of the present disclosure, techniques are provided for forming resonator devices using epitaxially grown piezoelectric elements. Note that use of "epitaxial" herein (e.g., "epitaxial layer" or "epitaxially grown elements") is intended to refer to the single crystal structure of at least part of the layer/element being described. In some embodiments, the resonator devices may be used in RF filters or for other suitable applications, such as for acoustic resonators, for duplexers, for multiplexers, for sensors, in conjunction with power amplifiers (PAs), or for low noise amplifiers (LNAs), for example. In some embodiments, the piezoelectric element of the resonator device may be epitaxial AlN or any other suitable epitaxial piezoelectric material, such as zinc oxide (ZnO) or lead zirconium titanate (PZT), or other III-V compounds, such as gallium nitride (GaN), indium nitride (InN), or other III-N materials, for example, as will be apparent in light of the present disclosure. As variously used herein, III-V compounds/materials include at least one group III element (e.g., aluminum, gallium, indium, boron, thallium) and at least one group V element (e.g., nitrogen, phosphorus, arsenic, antimony, bismuth). In some embodiments, group III element-nitride (III-N) compounds/materials may be particularly well-suited for the resonator piezoelectric element, due to III-N materials having high bandgaps and other desirable properties. III-N materials, as variously used herein, include a compound of one or more group III materials (e.g., aluminum, gallium, and/or indium), with nitrogen. Accordingly, III-N materials/compounds as variously used herein include, but are not limited to, GaN, InN, AlInN, AlGaN, InGaN, and AlInGaN. Note that such epitaxial materials are single crystal in nature. An interdigitated transducer (IDT) electrode structure is provisioned on the piezoelectric material and defines the operating frequency of the resonator device. In particular, the geometry (e.g., spacing and width) of the individual elements making up the IDT electrode structure defines the operating frequency. The geometry can be lithographically defined.

In some embodiments, the use of an epitaxially grown piezoelectric film for a resonator device can result in a two-dimensional electron gas (2DEG) inducible at the interface of a first epitaxial layer and a second epitaxial layer. In some embodiments, high quality epitaxially grown AN films and 2DEG-based bottom electrode contacts provide improved performance as compared to a film sputtered on an electrode. Each such resonator device further includes an upper IDT electrode structure lithographically configured to provide a desired operating frequency. Hence, multiple such resonator devices with different well-controlled operating frequencies can be readily provisioned on the same substrate.

In some embodiments, the techniques for forming resonator devices having an epitaxial piezoelectric film include initially growing a stack of materials on a substrate by an epitaxial method such as MOCVD, MBE, or any other suitable epitaxial growth process. In some such embodiments, the stack can include various III-V materials epitaxially grown on a group IV material substrate (e.g., a silicon (Si), silicon carbide (SiC), germanium (Ge), or SiGe substrate), a sapphire substrate, or any other suitable material substrate. For example, in one specific embodiment the III-V material stack may include a nucleation layer, an epitaxially grown gallium nitride (GaN) layer, an epitaxially grown AlN piezoelectric layer, and other III-V layers, such as a buffer layer and a polarization layer, as will be appreciated in light of the present disclosure. In another specific example embodiment, the III-V material stack may include an epitaxially grown nucleation layer, an epitaxially grown n-doped GaN layer, an epitaxially grown AlN layer, an epitaxially grown GaN piezoelectric layer, and other III-V layers may also be included.

Use of the techniques and structures provided herein may be detectable using tools such as scanning/transmission electron microscopy (SEM/TEM), composition mapping, x-ray crystallography or diffraction (XRD), secondary ion mass spectrometry (SIMS), time-of-flight SIMS (ToF-SIMS), atom probe imaging, local electrode atom probe (LEAP) techniques, 3D tomography, high resolution physical or chemical analysis, to name a few suitable example analytical tools. In particular, such tools may indicate an integrated circuit configured with one or more resonator structures including an epitaxial piezoelectric film and may further reveal an IDT-based electrode provisioned on that film, as variously described herein. For example, in some embodiments, an epitaxial AlN or GaN piezoelectric film may be detected between a top and bottom electrode of a resonator structure, and the top electrode may have an IDT-based electrode thereon. In some such embodiments, the top electrode or bottom electrode can include a 2DEG (sometimes referred to herein as a 2DEG-based electrode). In some such embodiments, the thickness and/or film quality of the resonator piezoelectric layer may be indicative that the techniques variously described herein have been used. Numerous benefits, configurations, and variations will be apparent in light of this disclosure.

Architecture and Methodology

FIGS. 1A-1E illustrate example integrated circuit structures defining a resonator device including a first epitaxial layer of group III-V semiconductor material and a second epitaxial layer of group III-V semiconductor material, in accordance with an embodiment of the present disclosure. Note that in the example structure of FIGS. 1A-1E, although GaN is used as an example first epitaxial group III-V semiconductor material and AlN is used as an example second epitaxial group III-V semiconductor material, the present disclosure is not intended to be so limited. For example, in some embodiments, the epitaxial layer material may include other group III material-nitride (III-N) compounds (e.g., any combination of one or more of gallium, indium, and aluminum with nitrogen). As will be apparent in light of the present disclosure, in some embodiments, the processing techniques variously described herein are applicable to forming resonators including other piezoelectric materials, such as ZnO or PZT, or other III-V compounds such as GaN or indium nitride InN, for example, or any other suitable piezoelectric material, depending on the end use or target application. Therefore, the techniques variously described herein can be defining various resonator structures including higher quality single crystal (of epitaxial versus sputtering) piezoelectric film, resulting in higher piezoelectric coupling coefficients, which leads to higher Q-factor for RF filters that include such resonator structures.

FIG. 1A illustrates a substrate 110 and a nucleation layer 120 formed on the substrate 110, in accordance with an example embodiment of the present disclosure. In this example embodiment, the nucleation layer 120 can be a thin Aluminum Nitride (AlN) layer and can be formed on the substrate 110 using epitaxial growth, for example MOCVD and/or MBE processes. However, in some embodiments, the layers may be grown or deposited using one or more other suitable processes. In some embodiments, substrate 110 may be a bulk substrate of one or more group IV materials, such as a bulk single crystal Si, Ge, SiC, or SiGe substrate, or substrate 110 may be a sapphire substrate, or substrate 110 may include any other suitable material. In some embodiments, substrate 110 may be an X on insulator (XOI) structure where X comprises single crystal Si, Ge, SiC, SiGe, or sapphire, and the insulator material is an oxide material or dielectric material or some other electrically insulating material or some other suitable multilayer structure where the top layer comprises single crystal Si, Ge, SiC, SiGe, or sapphire.

Although substrate 110 is illustrated in FIG. 1A as having a similar thickness as the other layers 130, 140, in some instances substrate 110 may be much thicker than those other layers, such as on the order of at least 10, 100, or 1000 times thicker than those layers. For example, where substrate 110 is a bulk substrate, it may have a thickness in the range of 100 to 950 microns. In some embodiments, substrate 110 may be used for one or more other integrated circuit (IC) devices, such as various diodes (e.g., light-emitting diodes (LEDs) or laser diodes), various transistors (e.g., metal-oxide-semiconductor field-effect transistors (MOSFETs) or tunnel FETs (TFETs)), various microelectromechanical systems (MEMS), various nanoelectromechanical systems (NEMS), various sensors, or any other suitable semiconductor or IC devices, depending on the end use or target application. Accordingly, in some embodiments, the resonator structures may be included in various system-on-chip (SoC) applications, as will be apparent in light of the present disclosure.

Continuing with the example structure of FIG. 1A, nucleation layer 120 is formed above and on substrate 110. In some embodiments, the nucleation layer 120 may be formed to accommodate lattice mismatch and, hence, strain between the layers. In some cases, the nucleation layer 120 may prevent subsequent layers (e.g., layer 130) from reacting with the substrate material. For example, where substrate 110 is a bulk Si substrate and layer 130 is n-type doped InGaN and/or GaN, nucleation layer 120 may be deposited prior to deposition of layer 130 to prevent layer 130 from directly contacting the Si substrate. Thus, in some such embodiments, the material, thickness, and deposition conditions may be dictated by the characteristics of substrate 110 and/or layer 130. In some embodiments, nucleation layer 120 may not be needed, as layer 130 may be compatible with substrate 110, such that layer 130 material can be deposited or grown directly on the material of substrate 110. Accordingly, in some embodiments, nucleation layer 120 may be optional. In some embodiments, the nucleation layer 120 may be a single crystal III-V material, such as AlN or a low temperature GaN layer (e.g., epitaxially grown at a temperature in the range of 700 to 950 degrees Celsius), for example. In some embodiments, where present, the nucleation layer 120 may have a thickness of 0.05 to 1 micron (e.g., 50 to 200 nm), less than 50 nm (e.g., 1 nm to 20 nm), or any other suitable thickness.

Figure 1B:
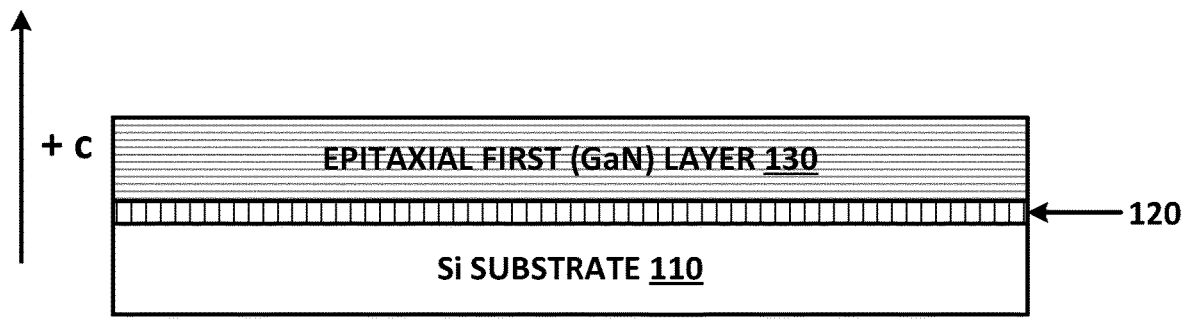

FIG. 1B illustrates an example structure formed after a first layer 130 is epitaxially grown on the nucleation layer 120. In this example structure, the first epitaxial layer is single crystal Gallium Nitride (GaN). In some cases, the GaN epitaxial layer is a Ga-polar crystalline lattice of GaN. The epitaxial first layer 130 is grown in the direction of the positive c-axis, as denoted by the +c and directional arrow in FIG. 1B, indicating the positive c-axis of crystalline growth. The layer 130 can be epitaxially grown according to any appropriate technique, such as CVD, MOCVD and/or MBE. In the example embodiment, a second single crystal layer is Aluminum Nitride (AlN) and is grown on the GaN along the positive c-axis of crystalline growth. In the example embodiment, the first layer is GaN, however other group III-V semiconductor materials can be implemented in accordance with an example embodiment of the present disclosure.

Figure 1C:
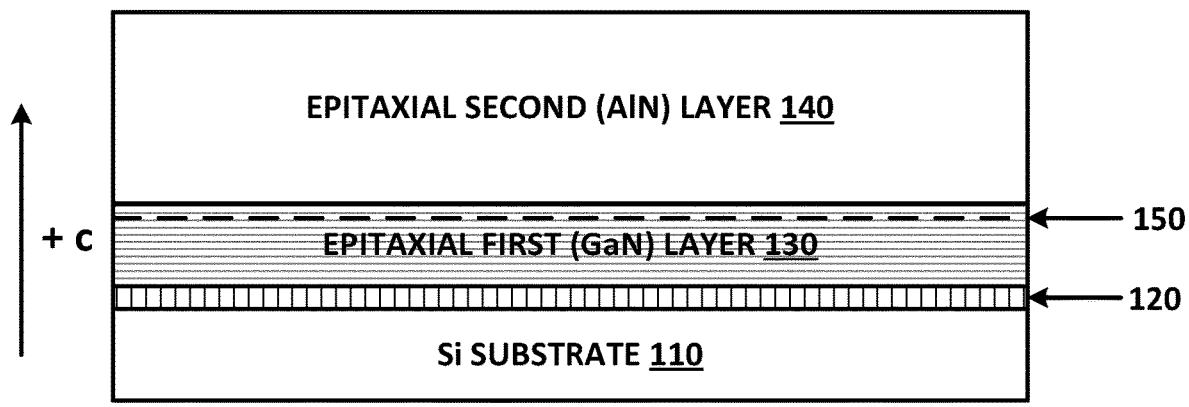

FIG. 1C illustrates an example structure formed after a second layer 140 is epitaxially grown on the first layer 130, in accordance with an example embodiment of the present disclosure. The layer 140 can be epitaxially grown according to any appropriate technique, such as CVD, MOCVD and/or MBE. The epitaxial second layer 140 is grown in the direction of the positive c-axis. In the example embodiment, the second layer is single crystal AlN and can be epitaxially grown on the GaN along the positive c-axis of crystalline growth. As shown in FIG. 1C, the second layer 140 on the first layer 130 provides a two-dimensional electron gas (2DEG) 150 within the first epitaxial layer 130. The 2DEG 150 is proximate the interface between the first epitaxial layer and the second epitaxial layer. As will be understood, a 2DEG configuration includes a gas of carriers (e.g., electrons or holes) free to move in two dimensions but tightly confined in the third.

Figure 1D:
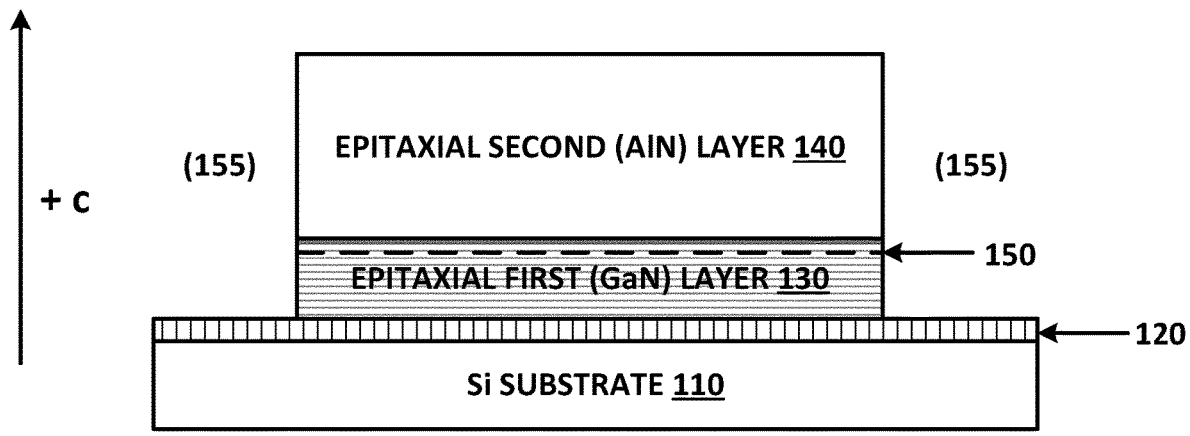

FIG. 1D illustrates an example structure that is formed after a cavity 155 is etched on opposing ends of the epitaxial stack that includes layers 130 and 140, in accordance with an example embodiment. Etching of the stack to form a cavity 155 on opposing ends of the epitaxial stack can be performed according to any technique for etching out a portion of a III-V semiconductor material, such as wet or vapor phase etching. Alternatively, the epitaxial stack that includes layers 130 and 140 could be grown from a trench etched into an oxide or other such template layer (shallow trench isolation) provided over the nucleation layer 120. The oxide layer (or other such template layer) can then be etched away to yield the structure shown in FIG. 1D. Other techniques for etching of the resulting structure in FIG. 1D will be apparent in light of the present disclosure. As will be further appreciated in light of this disclosure, the etching provides the area where the lower electrode contacts are provided, as will be discussed in turn.

Figure 1E:
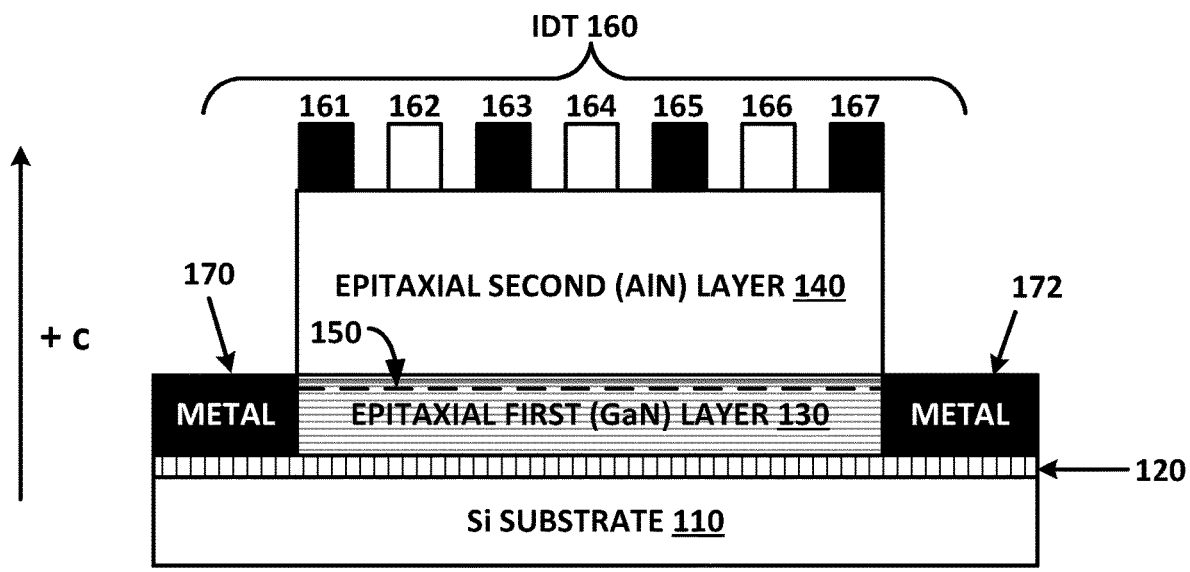

FIG. 1E illustrates an example structure formed after a plurality of interdigitated transducer (IDT) electrodes 160 are patterned on the second epitaxial layer 140 and metal contacts 170, 172 are formed adjacent to the lower electrode (layer 130), in accordance with an example embodiment of the present disclosure. As can be seen, the plurality of IDT electrodes 160, including IDT electrodes 161, 162, 163, 164, 165, 166 and 167 are patterned on a top surface of the second epitaxial layer 140 along the positive c-axis of crystalline growth. The IDT structure 160 can be patterned in metal, such as gold (Au), Platinum (Pt), Tungsten (W) or Aluminum (Al), via photolithography or other appropriate technique onto a piezoelectric material. In a more general sense, the metal can be any suitable metal or suitably conductive alloy, depending on the desired electrical and acoustic properties of the resonator device. The IDT structure 160 acts as a top electrode for the resonator in accordance with the example embodiment. The IDTs are lithographically defined such that the geometry of the IDTs determines the operating frequency. Thus, a number of these resonators as shown in FIG. 1E can be provisioned on a common substrate to allow for disparate frequency resonators on that substrate. The metal contacts 170, 172 for the bottom electrode are formed in the cavity (see cavity 155 in FIG. 1D) adjacent to opposing ends of the layer 130.

Figure 1F:
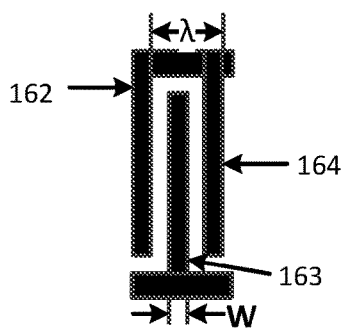
FIG. 1F illustrates a top view of the interdigitated transducer (IDT) electrodes of FIG. 1E, in accordance with an example embodiment of the present disclosure.

FIG. 1F illustrates a top view of the IDT electrodes of FIG. 1E. This shows the top view of some of the IDT electrodes (e.g., 162, 163, and 164). The filter operating frequency can be defined by the width (W) and spacing of the IDT electrodes, where the width is equal to the resonant frequency (A) of interest divided by 4, in accordance with an example embodiment of the present disclosure.

The 2DEG 150 allows layer 130 to act as the bottom electrode, in accordance with an example embodiment. In particular, the 2DEG 150 allows layer 130 to effectively be a conductive sheet at a constant potential, which is beneficial as it establishes a well-defined boundary condition (bottom electrode) for electric fields, in accordance with an example embodiment of the present disclosure. The 2DEG 150 also ensures full use of the piezoelectric material throughout its thickness, in accordance with an example embodiment of the present disclosure.

The structure of FIG. 1E can operate as an FBAR device, by waves propagating through the bulk material (e.g., the epitaxial stack vibrating up and down or left to right). In an FBAR device, a technique can be used to limit interaction of acoustic waves with the substrate. To this end, Bragg reflectors and/or a high impedance mismatch boundary such as a lower air cavity can be used, according to some embodiments. In one such embodiment, after fabrication as shown in FIG. 1E, the substrate can be etched selectively with respect to the other layers to provide such an air cavity. For example, a Si substrate can be selectively etched with respect to an AlN or GaN nucleation layer 120. Any number of etch chemistries that are selective to a target material to be removed and that remove little or none of non-target materials can be used to create the air cavity. Alternatively, a substrate manipulation scheme can be used, such as the example case where the substrate of the resonator structure shown FIG. 1E is removed and replaced with a second substrate having a surface based trench located under and adjacent to the resonator.

Figure 2:
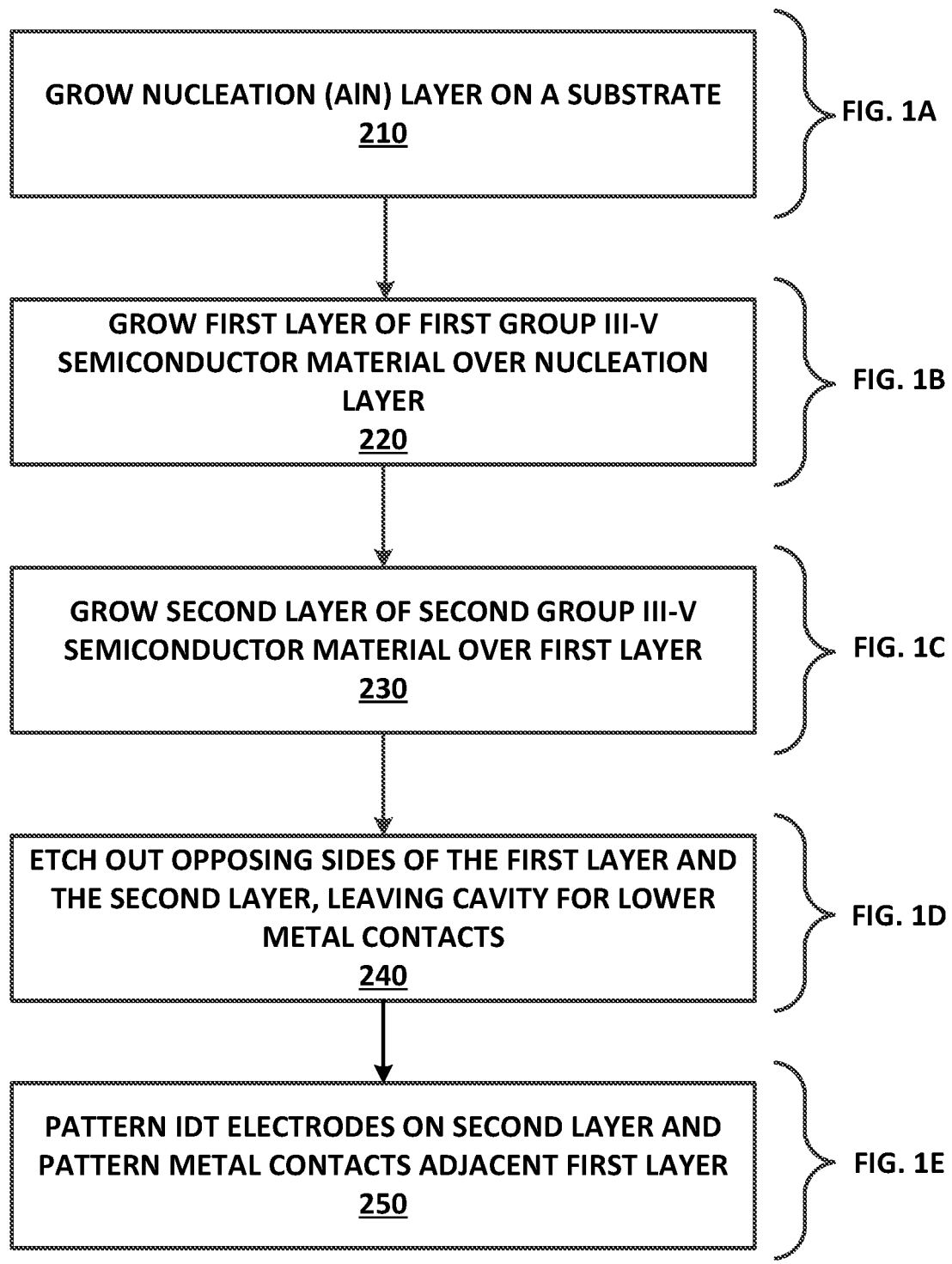
FIG. 2 illustrates a methodology for forming an integrated circuit according to FIGS. 1A-1E, in accordance with an example embodiment of the present disclosure.

FIG. 2 illustrates a methodology for forming an integrated circuit according to FIGS. 1A-1E, in accordance with an example embodiment of the present disclosure. A nucleation layer is grown on a substrate at 210. An example structure showing a nucleation layer grown on a substrate is shown in FIG. 1A. In one example embodiment, the nucleation layer is a thin film layer of single crystal Aluminum Nitride (AlN). It will be appreciated that the nucleation layer is not required.

A first layer of a first group III-V semiconductor material is grown over the nucleation layer at 220, in this example embodiment. An example structure showing a first layer of a first group III-V semiconductor material and nucleation layer is shown in FIG. 1B. In one example embodiment, the first layer of the first group III-V semiconductor material comprises single crystal GaN, however other single crystal group III-V semiconductor materials may be implemented. In one example embodiment, the GaN is Ga-polar to form the structure shown in FIG. 1B. The first layer (GaN in this example embodiment) can be epitaxially grown on the nucleation layer according to any appropriate epitaxy technique, such as CVD, MOCVD or MBE.

A second layer of a second group III-V semiconductor material is grown over the first layer at 230, in this example embodiment. An example structure showing the second layer grown over the first layer is shown in FIG. 1C, in accordance with an example embodiment of the present disclosure. The second layer (single crystal AlN in this example embodiment) can be epitaxially grown on the first layer according to any appropriate epitaxy technique, in accordance with an example embodiment of the present disclosure. This structure can induce a 2DEG in the first layer, as previously explained.

The method continues at 240, where opposing sides of the first layer and the second layer are etched out using any appropriate etching technique in accordance with an example embodiment of the present disclosure. This leaves a cavity on opposing sides of the epitaxially grown layers, and a place for providing the lower electrode contacts. Alternatively, a trench-based growth process can be used to provide the first and second layers, and the material in which the trench is formed can then be removed, as previously explained.

The method of this example embodiment continues at 250, where a plurality of IDT electrodes are patterned or otherwise disposed on the second layer of group III-V semiconductor material and metal contacts are formed in the cavity adjacent the first epitaxial layer that includes the 2DEG. The metal contacts are formed on the substrate or the nucleation layer (when present). An example structure including the patterned IDT electrodes is shown in FIG. 1E. The lithographic patterning of IDT electrodes provides the operating frequency of the resonator (e.g., FBAR or TBAR), as previously explained.

FIGS. 3A-3F illustrate example integrated circuit structures having a resonator device including a first epitaxial layer of group III-V semiconductor material and a second epitaxial layer of group III-V semiconductor material, in accordance with another embodiment of the present disclosure. In this example embodiment, the first epitaxial layer is single crystal AlN and the second epitaxial layer is single crystal GaN, however other III-V semiconductor materials may be implemented.

Figure 3A:
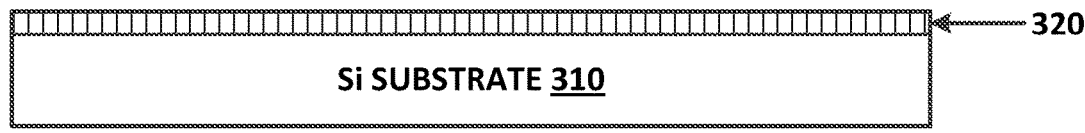
FIGS. 3A-3F illustrate example integrated circuit structures defining a resonator device including a first epitaxial group III-V semiconductor material, in accordance with another embodiment of the present disclosure.

FIG. 3A illustrates a nucleation layer 320 formed on a substrate 310, in accordance with another example embodiment of the present disclosure. In this example embodiment, the nucleation layer can be a relatively thin single crystal AlN layer and can be formed on the substrate 310 using epitaxial growth, for example MOCVD and/or MBE processes. However, in some embodiments, the layers may be grown or deposited using one or more other suitable processes. In some embodiments, substrate 310 may be a bulk single crystal substrate of one or more group IV materials, such as a bulk Si, Ge, SiC, or SiGe substrate, or substrate 310 may be a sapphire substrate, or substrate 310 may include any other suitable material. In some embodiments, substrate 310 may be an X on insulator (XOI) structure where X comprises single crystal Si, Ge, SiC, SiGe, or sapphire, and the insulator material is an oxide material or dielectric material or some other electrically insulating material or some other suitable multilayer structure where the top layer comprises single crystal Si, Ge, SiC, SiGe, or sapphire.

In some embodiments, the nucleation layer 320 may be formed to prevent subsequent layers (e.g., layer 330) from reacting with the substrate material. For example, where substrate 310 is a bulk Si substrate and layer 330 is n-type doped InGaN and/or GaN, nucleation layer 320 or another insulator may be deposited prior to deposition of layer 330 to prevent layer 310 from directly contacting the Si substrate. The nucleation layer 320 also accommodates strain caused by lattice mismatch on the Si substrate. Thus, in some such embodiments, the material, thickness, and deposition conditions may be dictated by the characteristics of substrate 310 and/or layer 330. In some embodiments, nucleation layer 320 may not be needed, as layer 330 may be compatible with substrate 310, such that a layer 330 can be deposited or grown directly on the material of substrate 310. Accordingly, in some embodiments, nucleation layer 320 may be optional. In some embodiments, the nucleation layer 320 may be a single crystal III-V material, such as AlN or a low temperature GaN layer (e.g., epitaxially grown at a temperature in the range of 700 to 950 degrees Celsius), for example. In some embodiments, where present, the nucleation layer 320 may have a thickness of 0.05 to 1 micron (e.g., 50 to 200 nm), less than 50 nm (e.g., 1 nm to 20 nm), or any other suitable thickness.

Figure 3B:
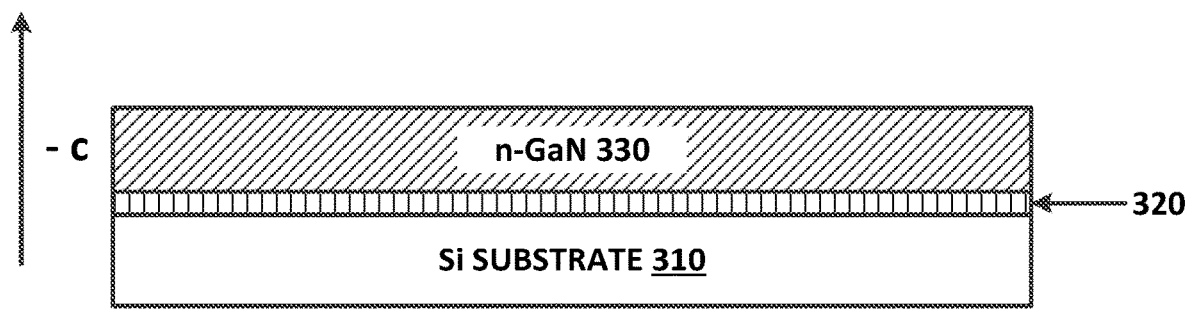

FIG. 3B illustrates an example structure that is formed after a bottom electrode is formed on the nucleation layer 320. In this example embodiment, the bottom electrode is formed by a single crystal n-doped GaN (n-GaN) layer 330 that is formed on the nucleation layer 320. The n-GaN layer 330 acts as a bottom electrode for the overall resonator device structure. As shown, the n-GaN layer 330 is grown along the negative c-axis (−c) of crystalline growth, as denoted by the −c and directional arrow in FIG. 3B. The n-GaN layer 330 can be deposited on the nucleation layer 320 according to any appropriate epitaxial growth technique in accordance with an example embodiment of the present disclosure, for example CVD, MOCVD or MBE or other technique for provisioning monocrystalline material.

Figure 3C:
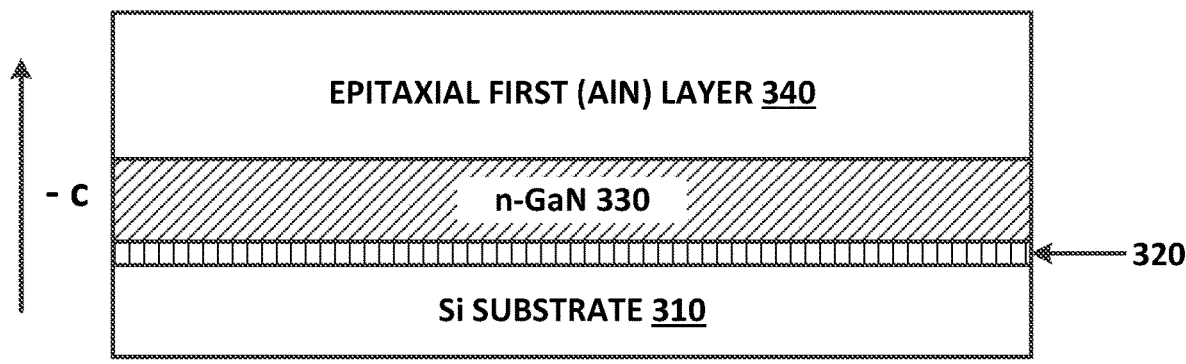

FIG. 3C illustrates an example structure that is formed after a first layer 340 of III-V semiconductor material is formed on the n-doped GaN layer 330, in accordance with an example embodiment of the present disclosure. In accordance with an example embodiment, the first layer 340 of III-V material can comprise single crystal AlN. The epitaxial first layer 340 is grown along the negative c-axis of crystalline growth. The layer 340 can be grown on the n-GaN layer 330 according to any appropriate epitaxial growth technique, in accordance with an example embodiment of the present disclosure. Example epitaxial growth processes include CVD, MOCVD and MBE, as well as others that will be appreciated in light of the present disclosure.

Figure 3D:
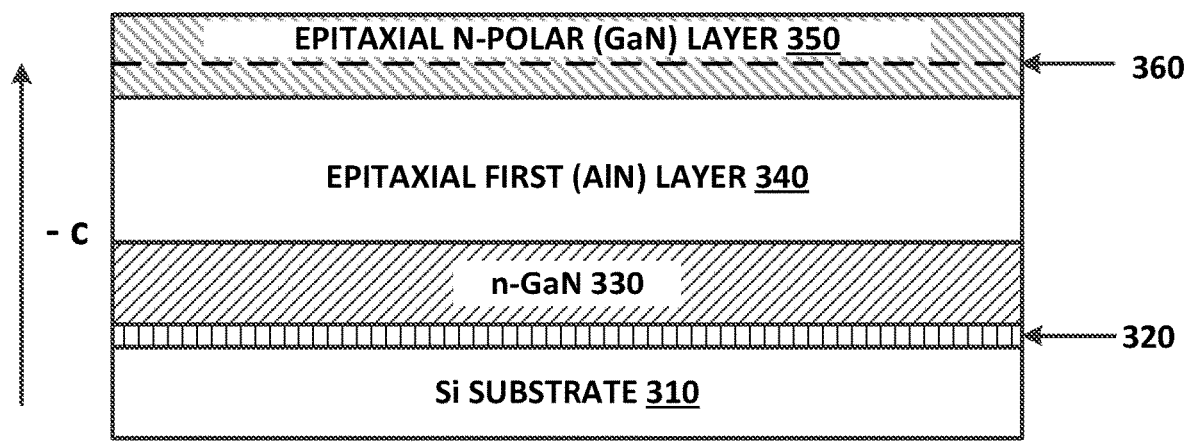

FIG. 3D illustrates an example structure that is formed after a second layer 350 of III-V semiconductor material is formed on the first layer 340. The second layer 350 is formed on the first layer 340 along the negative c-axis of crystalline growth. In accordance with an example embodiment, the second layer 350 of III-V material can comprise single crystal GaN. In some cases, the second layer 350 can be N-polar GaN. The second layer 350 can be epitaxially grown on the first layer 340 according to any appropriate epitaxial growth process, such as CVD, MOCVD or MBE.

Depositing the second epitaxial layer 350 on the first epitaxial layer 340 induces a 2DEG 360 within the second layer, proximate an interface between the second layer 350 and the first layer 340.

Figure 3E:
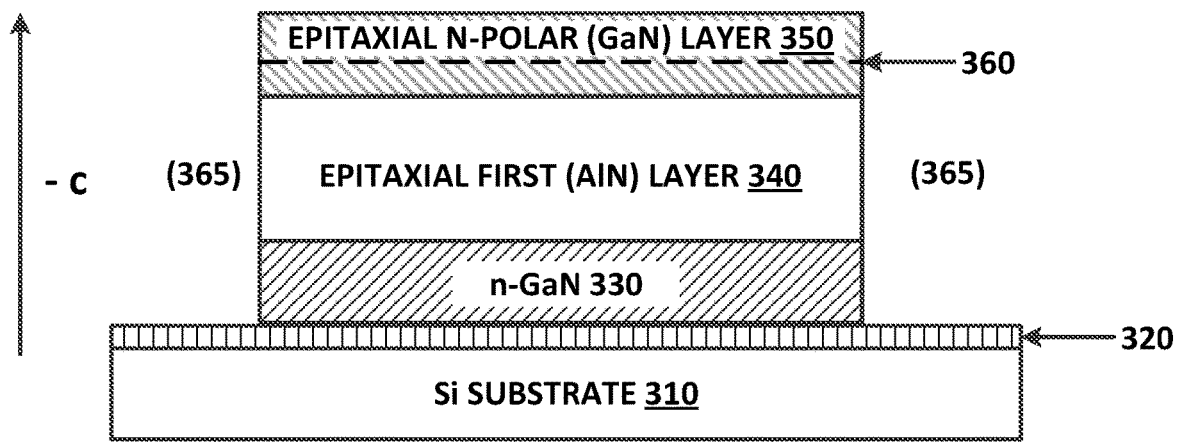

FIG. 3E illustrates an example structure that is formed after etching a portion on opposing ends of layers 330, 340 and 350, in accordance with an example embodiment of the present disclosure. A cavity 365 is formed on opposing ends of the layer 330, 340 and 350. Etching can be performed according to any appropriate etching technique, as will be appreciated in light of the present disclosure. Etching of the stack to form a cavity 365 on opposing ends of the epitaxial stack can be performed according to any technique for etching out a portion of a III-V semiconductor material, such as wet or vapor phase etching. Other techniques for etching of the cavity will be apparent in light of the present disclosure (e.g., trench-based growth of layers 330, 340, and 350, followed by removal STI or other material in which trench is formed). As will be appreciated in light of this disclosure, the etching provides the area where the lower electrode contacts will be provided, as will be discussed in turn.

Figure 3F:
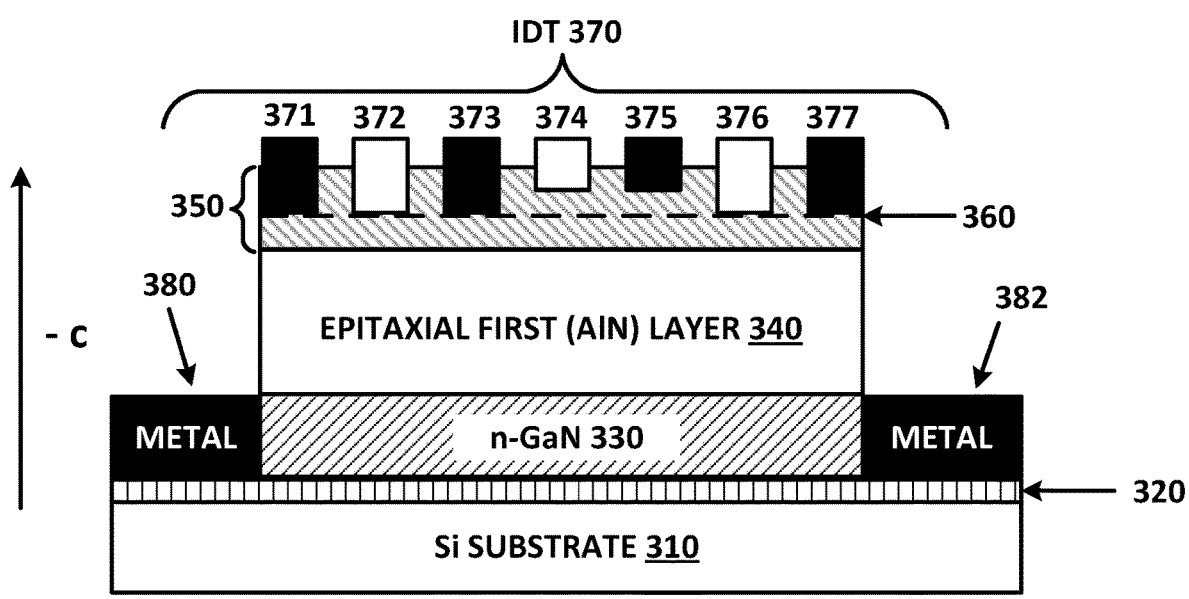

FIG. 3F illustrates an example structure that is formed after a plurality of IDT electrodes 370 are formed on a top surface of the second layer 350 and metal contacts 380, 382 are formed in the cavity on opposing sides of the epitaxial layer 330. In accordance with an example embodiment of the present disclosure, the plurality of IDT electrodes 370 includes electrode 371, electrode 372, electrode 373, electrode 374, electrode 375, electrode 376 and electrode 377. In the structure of FIG. 3E, the n-GaN layer 330 acts as a bottom electrode, and the IDT structure 370 acts as the top electrode for the resonator device along the negative c-axis direction of crystalline growth. At least some of the plurality of IDT electrodes (371, 372, 373, 376 and 377) extend fully down to, and contact, the 2DEG 360 in the second layer 350, whereas at least some of the plurality of IDT electrodes (374 and 375) extend into the second layer 350 but do not contact the 2DEG 360. As previously explained, the geometry of the IDT electrodes effectively defines the operating frequency of the filter.

The n-doped GaN layer 330 acts as a bottom electrode for the structure, and works together with the IDT 370 under the influence of the 2DEG 360, in accordance with an example embodiment of the present disclosure. The n-GaN 330 is sufficiently conductive to act as the lower electrode. To drive the acoustic waves, an AC electric field is applied across the epitaxial stack, between the bottom electrode (n-GaN 330) and the IDT electrodes. The 2DEG is effectively used as an ON/OFF control switch. In more detail, when the 2DEG potential is allowed to float, electric fields from the electrodes not contacting the 2DEG penetrate into the first epitaxial layer. If the 2DEG is held at a fixed potential, electric fields generated from the electrodes not contacting the 2DEG terminate on the 2DEG and do not penetrate into the first epitaxial layer. When a negative bias voltage is applied to the IDT electrodes, the 2DEG can be depleted away. The operating frequency of the device is lithographically set by the geometry of the IDT electrodes 370. The IDT electrodes 370 of different resonators can thus be specifically configured for specific different operating frequencies, all on the same substrate.

Figure 4:
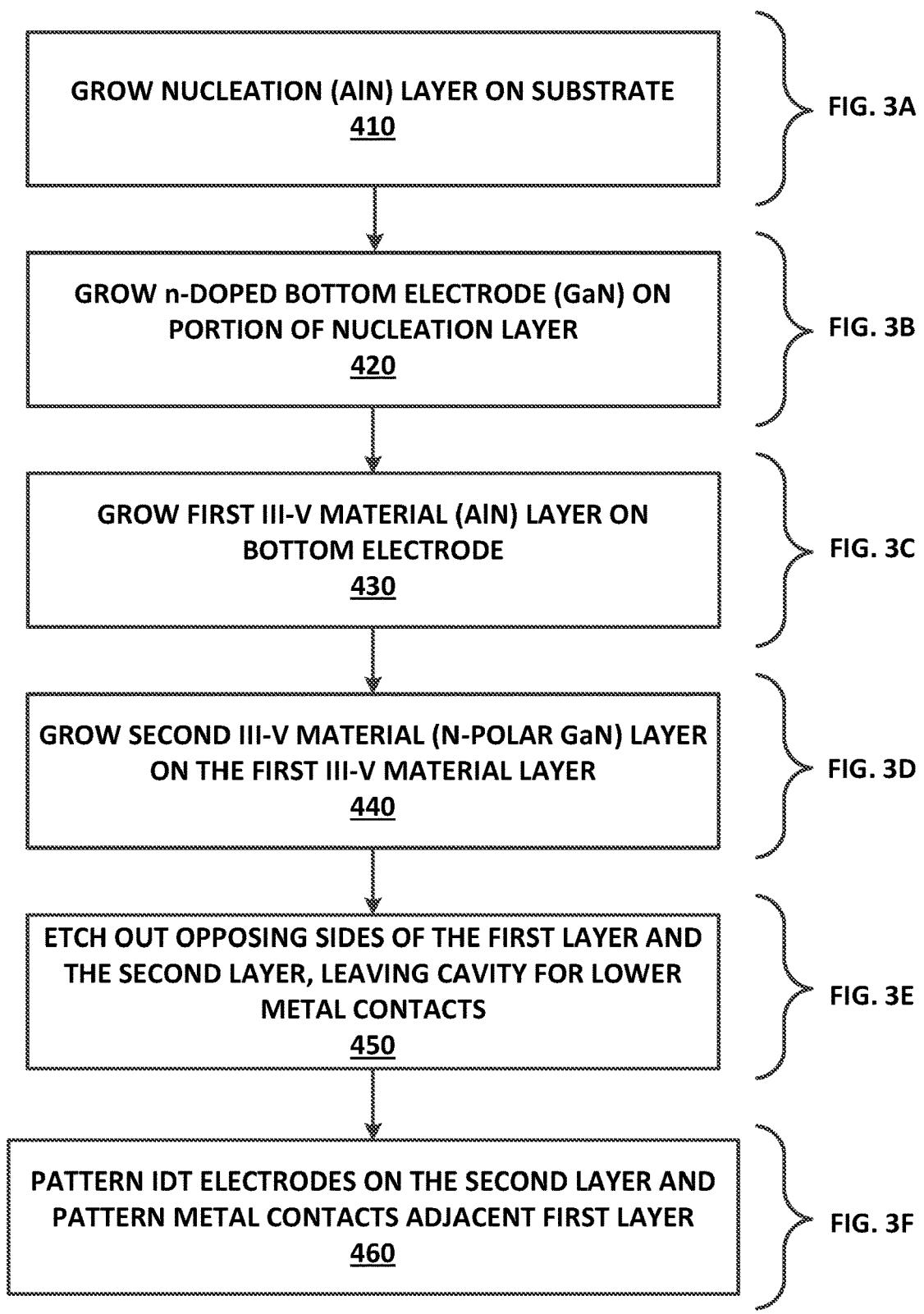
FIG. 4 illustrates a methodology for forming an integrated circuit according to FIGS. 3A-3F, in accordance with an example embodiment of the present disclosure.

FIG. 4 illustrates a methodology for forming an integrated circuit according to FIGS. 3A-3E, in accordance with an example embodiment of the present disclosure. At 410, nucleation layer is grown on a substrate, in accordance with an example embodiment of the present disclosure. An example structure showing a nucleation layer grown on a substrate is shown in FIG. 3A. In one example embodiment, the nucleation layer can be a thin film layer of single crystal Aluminum Nitride (AlN). It will be appreciated that the nucleation layer is not required.

At 420, a bottom electrode (for example layer 330) is formed on the nucleation layer, in accordance with an example embodiment of the present disclosure. An example structure showing the bottom electrode formed on the nucleation layer is shown in FIG. 3B. In this example embodiment, the bottom electrode comprises a single crystal n-doped III-V semiconductor material, such as single crystal GaN in accordance with an example embodiment, and can be other III-V semiconductor materials, as will be appreciated in light of the present disclosure.

At 430, a first layer (for example layer 340) of a first group III-V semiconductor material is grown on the bottom electrode, in accordance with an example embodiment of the present disclosure. An example structure showing the first layer of a first group III-V semiconductor material grown on the bottom electrode is shown in FIG. 3C.

At 440, a second layer (for example layer 350) of a second group III-V semiconductor material is grown on the first layer of the first group III-V semiconductor material, in accordance with an example embodiment of the present disclosure. An example structure showing the second layer grown on the first layer is shown in FIG. 3D. In accordance with the example embodiment, the second group III-V semiconductor material comprises single crystal GaN, which in some cases can be N-polar (nitrogen-polar) GaN. Note that the 2DEG is in the second layer when the second layer is grown on the first layer in the negative c-axis direction of crystalline growth.

At 450, a cavity is etched on opposing sides of the epitaxial stack, in accordance with an example embodiment. Etching of the stack to form a cavity on opposing sides of the epitaxial stack can be performed according to any suitable technique for etching out a portion of a III-V semiconductor material, such as wet or vapor phase etching. Alternatively, a trench-based lateral epitaxial overgrowth (sometimes called LEO) deposition technique can be used. Other techniques for etching of the cavity will be apparent in light of the present disclosure. An example structure that includes the cavity formed on opposing sides of the epitaxial stack is shown in FIG. 3E.

At 460, a plurality of IDT electrodes are patterned 460 on the second layer of the second III-V semiconductor material and metal contacts are patterned adjacent the first layer in the cavity on opposing sides of the first layer, in accordance with an example embodiment of the present disclosure. The metal contacts are formed on the substrate or the nucleation layer (when present). An example structure showing the plurality of IDT electrodes patterned on the second epitaxial layer is shown in FIG. 3F.

Numerous variations and configurations will be apparent in light of the preset disclosure.

Example System

Figure 5:
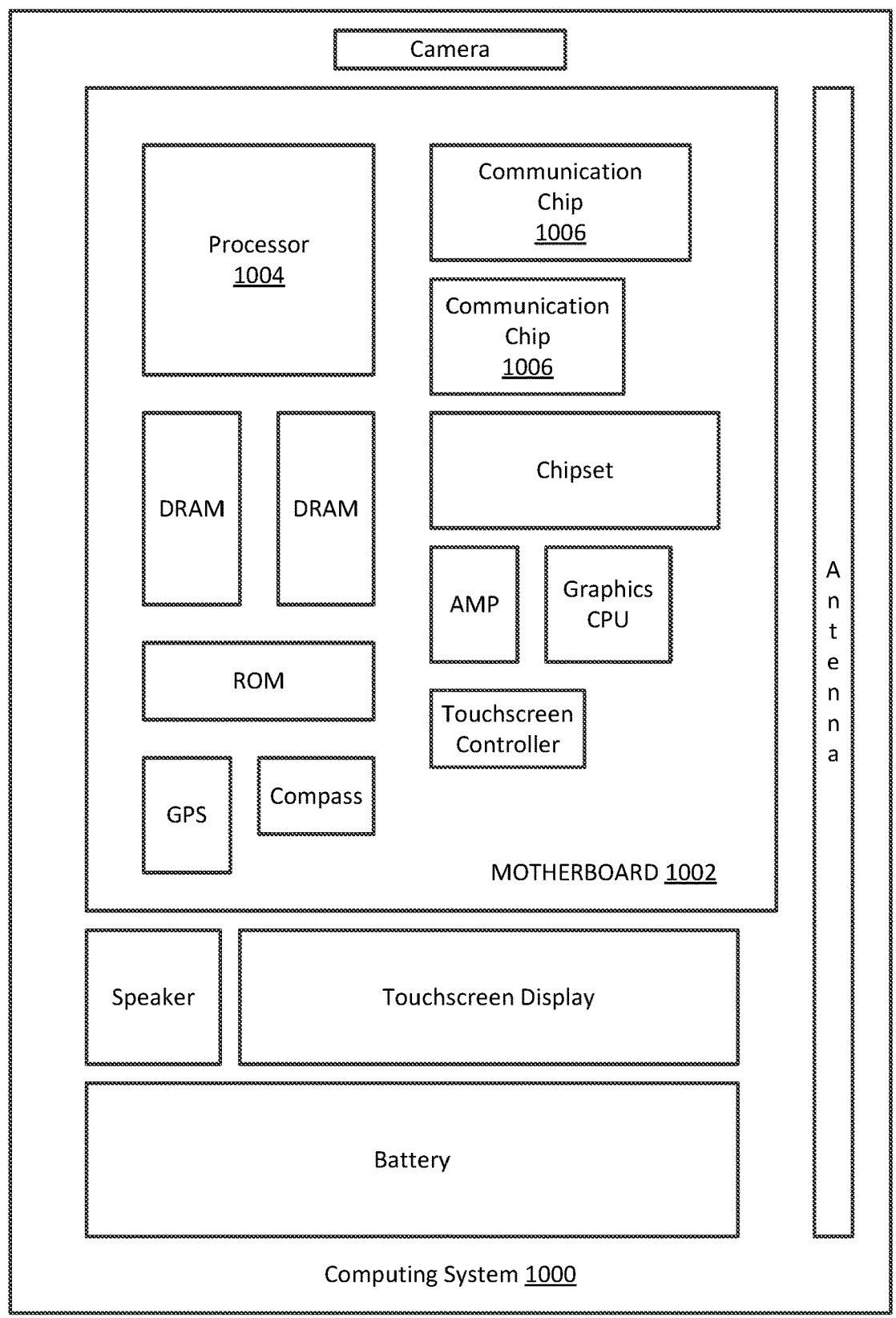
FIG. 5 illustrates a computing system implemented with integrated circuit structures or devices formed using the techniques disclosed herein, in accordance with some embodiments of this disclosure.

FIG. 5 illustrates a computing system 1000 configured with one or more integrated circuit structures or devices formed using the techniques disclosed herein, in accordance with some embodiments. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the techniques provided herein (e.g., epitaxial filter structure having a 2DEG-based electrode). In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

FURTHER EXAMPLE EMBODIMENTS

The following examples pertain to further embodiments, from which numerous permutations and configurations will be apparent.

Example 1 includes an integrated circuit resonator device comprising: a substrate; a first epitaxial layer formed over the substrate along a positive c-axis of crystalline growth, the first epitaxial layer comprising a first group III-V semiconductor material; a second epitaxial layer formed on the first epitaxial layer along the positive c-axis, the second epitaxial layer comprising a second group III-V semiconductor material; and a 2D electron gas (2DEG) in the first epitaxial layer, the 2DEG inducible along the positive c-axis proximate an interface between the first epitaxial layer and the second epitaxial layer.

Example 2 includes the subject matter of Example 1, further including metal contacts adjacent the first epitaxial layer, wherein the metal contacts and the first epitaxial layer collectively provide a bottom electrode of the resonator device.

Example 3 includes the subject matter of any of Examples 1-2, further including a plurality of inter-digitated transducer (IDT) electrodes disposed on the second epitaxial layer.

Example 4 includes the subject matter of Example 3, wherein the plurality of IDT electrodes are configured to provide a desired operating frequency.

Example 5 includes the subject matter of any of Examples 1-3, wherein the first group III-V semiconductor material has a first band gap that is lower than a second band gap of the second group III-V semiconductor material.

Example 6 includes the subject matter of Example 5, wherein the first group III-V semiconductor material is Gallium-Nitride (GaN) and the second group III-V semiconductor material is Aluminum-Nitride (AlN).

Example 7 includes the subject matter of Example 6, wherein the first group III-V semiconductor material comprises a Ga-polar crystalline lattice of GaN.

Example 8 includes the subject matter of any of Examples 1-7, further including a nucleation layer formed between the substrate and the first epitaxial layer.

Example 9 includes a radio frequency (RF) filter device comprising the integrated circuit resonator device of any of Examples 1-8.

Example 10 includes an integrated circuit resonator device comprising: a substrate; a first epitaxial layer formed over the substrate along a negative c-axis of crystalline growth, the first epitaxial layer comprising a first group III-V semiconductor material; a second epitaxial layer formed on the first epitaxial layer along the negative c-axis, the second epitaxial layer comprising a second group III-V semiconductor material; and a 2D electron gas (2DEG) in the second epitaxial layer, the 2DEG inducible along the negative c-axis proximate an interface between the first epitaxial layer and the second epitaxial layer.

Example 11 includes the subject matter of Example 10, and further including metal contacts adjacent the first epitaxial layer, wherein the metal contacts and the first epitaxial layer collectively provide a bottom electrode of the resonator device.

Example 12 includes the subject matter of any of Examples 10-11, further including a plurality of inter-digitated transducer (IDT) electrodes disposed on the second epitaxial layer.

Example 13 includes the subject matter of Example 12, wherein the plurality of IDT electrodes are configured to provide a desired operating frequency.

Example 14 includes the subject matter of Example 12, wherein at least a first plurality of IDT electrodes extend down to and contact the 2DEG, and at least a second plurality of IDT electrodes do not extend to the 2DEG.

Example 15 includes the subject matter of any of Examples 10-14, wherein the first group III-V semiconductor material has a first band gap that is greater than a second band gap of the second group III-V semiconductor material.

Example 16 includes the subject matter of any of Examples 10-15, wherein the first group III-V semiconductor material comprises Aluminum-Nitride (AlN) and the second group III-V semiconductor material comprises Gallium-Nitride (GaN).

Example 17 includes the subject matter of Example 16, wherein the second group III-V semiconductor material comprises a N-polar crystalline lattice of GaN.

Example 18 includes the subject matter of any of Examples 10-17, further including an n-doped GaN layer as a bottom electrode.

Example 19 includes the subject matter of Example 18, further including metal contacts adjacent respective ends of the n-doped GaN layer.

Example 20 includes the subject matter of any of Examples 10-18, and further includes a nucleation layer formed between the substrate and the first epitaxial layer.

Example 21 includes a radio frequency (RF) filter device including the integrated circuit resonator device of any of Examples 10-20.

Example 22 includes a method of forming a resonator device, the method comprising: epitaxially depositing a first epitaxial layer over a substrate along a positive c-axis of crystalline growth, the first epitaxial layer comprising a first group III-V semiconductor material; epitaxially depositing a second epitaxial layer on the first epitaxial layer along the positive c-axis, the second epitaxial layer comprising a second group III-V semiconductor material, thereby allowing for inducement of a 2D electron gas (2DEG) along the positive c-axis proximate an interface between the first epitaxial layer and the second epitaxial layer; and providing a plurality of inter-digitated transducer (IDT) metal electrodes on a top surface of the second epitaxial layer along the positive c-axis.

Example 23 includes the subject matter of Example 22, and further includes providing first and second metal contacts adjacent to and in contact with respective ends of the first epitaxial layer.

Example 24 includes the subject matter of any of Examples 22-23, wherein the first group III-V semiconductor material has a first band gap that is lower than a second band gap of the second group III-V semiconductor material.

Example 25 includes the subject matter of any of Examples 22-24, wherein the first group III-V semiconductor material is Gallium-Nitride (GaN) and the second group III-V semiconductor material is Aluminum-Nitride (AlN).

Example 26 includes the subject matter of Example 25, wherein the first group III-V semiconductor material comprises a Ga-polar crystalline lattice of GaN.

Example 27 includes the subject matter of any of Examples 22-26, wherein the epitaxially depositing the first epitaxial layer and the second epitaxial layer are performed using at least one of a chemical vapor deposition (CVD), a metal-organic chemical vapor deposition (MOCVD) and molecular-beam epitaxy (MBE) process.

Example 28 includes the subject matter of any of Examples 22-27, and further includes forming a radio frequency (RF) filter device.

Example 29 includes a method of forming a resonator device, the method comprising: epitaxially depositing a first epitaxial layer over a substrate along a negative c-axis of crystalline growth, the first epitaxial layer comprising a first group III-V semiconductor material; epitaxially depositing a second epitaxial layer on the first epitaxial layer along the negative c-axis, the second epitaxial layer comprising a second group III-V semiconductor material, thereby inducing a 2D electron gas (2DEG) along the negative c-axis proximate an interface between the first epitaxial layer and the second epitaxial layer; and patterning a plurality of inter-digitated transducer (IDT) metal electrodes along the negative c-axis on a top surface of the second epitaxial layer.

Example 30 includes the subject matter of Example 29, wherein the first group III-V semiconductor material comprises Aluminum-Nitride (AlN) and the second group III-V semiconductor material comprises Gallium-Nitride (GaN).

Example 31 includes the subject matter of any of Examples 29-30, wherein the second group III-V semiconductor material comprises a N-polar crystalline lattice of GaN.

Example 32 includes the subject matter of any of Examples 29-31, wherein at least one of the plurality of IDT electrodes extends down to and contacts the 2DEG, and at least a second of the plurality of IDT electrodes does not contact the 2DEG.

Example 33 includes the subject matter of any of Examples 29-32, wherein the epitaxially depositing the first epitaxial layer and the second epitaxial layer are performed using at least one of a chemical vapor deposition (CVD), a metal-organic chemical vapor deposition (MOCVD) and molecular-beam epitaxy (MBE) process.

Example 34 includes the subject matter of any of Examples 29-33, and further includes depositing an n-doped GaN layer on the substrate as a bottom electrode for the resonator device, and wherein the first epitaxial layer is deposited on the n-doped GaN layer.

Example 35 includes the subject matter of any of Examples 29-34, and further includes forming a radio frequency (RF) filter device.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

The invention claimed is:

1. An integrated circuit comprising:
   a substrate;
   a first epitaxial layer over the substrate and oriented along a positive c-axis of crystalline growth, the first epitaxial layer comprising a first group III-V semiconductor material;
   a second epitaxial layer on the first epitaxial layer and oriented along the positive c-axis, the second epitaxial layer comprising a second group III-V semiconductor material; and
   a plurality of inter-digitated transducer (IDT) electrodes on the second epitaxial layer;
   wherein a 2D electron gas (2DEG) is inducible in the first epitaxial layer along the positive c-axis proximate an interface between the first epitaxial layer and the second epitaxial layer.

2. The integrated circuit of claim 1, wherein the first group III-V semiconductor material has a first band gap that is lower than a second band gap of the second group III-V semiconductor material.

3. The integrated circuit of claim 2, wherein the first group III-V semiconductor material comprises gallium and nitrogen and the second group III-V semiconductor material comprises aluminum and nitrogen.

4. The integrated circuit of claim 3, wherein the first group III-V semiconductor material comprises a Ga-polar crystalline lattice of gallium nitride (GaN).

5. The integrated circuit of claim 1, further comprising a nucleation layer between the substrate and the first epitaxial layer.

6. The integrated circuit of claim 5, wherein the nucleation layer comprises aluminum and nitrogen.

7. The integrated circuit of claim 1, further comprising metal contacts adjacent the first epitaxial layer, wherein the metal contacts and the first epitaxial layer collectively provide a bottom electrode of a resonator device.

8. The integrated circuit of claim 1, wherein the plurality of IDT electrodes are configured to provide a desired operating frequency of a resonator device.

9. An integrated circuit comprising:
   a substrate;
   a first epitaxial layer over the substrate and oriented along a negative c-axis of crystalline growth, the first epitaxial layer comprising a first group III-V semiconductor material; and
   a second epitaxial layer on the first epitaxial layer and oriented along the negative c-axis, the second epitaxial layer comprising a second group III-V semiconductor material; wherein a 2D electron gas (2DEG) is inducible in the second epitaxial layer along the negative c-axis proximate an interface between the first epitaxial layer and the second epitaxial layer.

10. The integrated circuit of claim 9, further comprising a plurality of inter-digitated transducer (IDT) electrodes on the second epitaxial layer.

11. The integrated circuit of claim 10, wherein the plurality of IDT electrodes are configured to provide a desired operating frequency of a resonator device.

12. The integrated circuit of claim 10, wherein at least one or more of the IDT electrodes extend down into the second epitaxial layer, and one or more of IDT electrodes do not extend into the second epitaxial layer.

13. The integrated circuit of claim 9, wherein the first group III-V semiconductor material comprises aluminum and nitrogen and the second group III-V semiconductor material comprises gallium and nitrogen.

14. The integrated circuit of claim 13, wherein the second group III-V semiconductor material comprises an N-polar crystalline lattice of gallium nitride (GaN).

15. The integrated circuit of claim 9, further comprising a bottom electrode comprising gallium, nitrogen, and an n-type dopant.

16. The integrated circuit of claim 15, further comprising metal contacts adjacent respective ends of the bottom electrode.

17. The integrated circuit of claim 9, wherein the first group III-V semiconductor material has a first band gap that is greater than a second band gap of the second group III-V semiconductor material.

18. A method of forming a resonator device, the method comprising:
   epitaxially depositing a first epitaxial layer over a substrate along a positive c-axis of crystalline growth or a negative c-axis of crystalline growth, the first epitaxial layer comprising a first group III-V semiconductor material;
   epitaxially depositing a second epitaxial layer on the first epitaxial layer along the positive c-axis or the negative c-axis, the second epitaxial layer comprising a second group III-V semiconductor material, thereby allowing for inducement of a 2D electron gas (2DEG) along the positive c-axis proximate an interface between the first epitaxial layer and the second epitaxial layer or along the negative c-axis proximate an interface between the first epitaxial layer and the second epitaxial layer; and
   providing a plurality of inter-digitated transducer (IDT) metal electrodes on a top surface of the second epitaxial layer, the electrodes defining at least in part an operating frequency of the resonator device.

19. The method of claim 18, further comprising providing first and second metal contacts adjacent to and in contact with respective ends of the first epitaxial layer.

20. The method of claim 18, further comprising depositing an n-doped gallium nitride (GaN) layer on the substrate as a bottom electrode for the resonator device, and wherein the first epitaxial layer is deposited on the n-doped GaN layer.

* * * * *